United States Patent [19]

Brownhill et al.

[11] Patent Number: 5,036,428
[45] Date of Patent: Jul. 30, 1991

[54] PRINTED CIRCUIT BOARD RETAINER ASSEMBLY

[75] Inventors: Richard Brownhill, Huntington Beach; Martin D. Husted, Canyon Country, both of Calif.

[73] Assignee: EG&G Birtcher, Inc., El Monte, Calif.

[21] Appl. No.: 545,553

[22] Filed: Jun. 29, 1990

[51] Int. Cl.5 .............................................. H05K 7/20
[52] U.S. Cl. .................................. 361/386; 361/388; 361/399; 361/415; 165/80.1
[58] Field of Search ............... 361/386, 388, 389, 395, 361/399, 412, 415; 211/41; 165/80.1, 80.2, 80.3

[56]  References Cited
U.S. PATENT DOCUMENTS 4,298,904 11/1981 Koenig ................................. 361/386
4,414,605 11/1983 Chino et al. ........................ 361/388

Primary Examiner—Leo P. Picard
Assistant Examiner—Young S. Whang
Attorney, Agent, or Firm—Finnegan, Henderson, Farabow, Garrett & Dunner

[57]  ABSTRACT

An assembly is provided for holding a printed circuit board between spaced surfaces. The assembly comprises a plurality of wedge-shaped members slidably mounted end-to-end on a rod, with at least one of those members being movable in a transverse direction relative to the rod and to its respective adjacent members upon effective shortening of the rod to thereby bring a clamping surface of the transversely movable member into contact with a printed circuit board and to apply a clamping force thereto. The retainer is disposed in a recess of a base structure which includes an abutment formed at one end of the recess. The retainer is activated by rotating the rod thereby urging the slidably mounted members towards one another. Bevelled washers are disposed on the rod between the abutment and one of the end-most members which, when compressed upon tightening of the retainer, provide a force tending to urge the members away from the abutment. When the retainer assembly is loosened the urging force of the bevelled washers tends to move the members along the rod to overcome any surface tension and friction between the clamping surface of the movable member and the circuit board which may tend to preclude quick release of the clamping surface from the board.

13 Claims, 2 Drawing Sheets

PRINTED CIRCUIT BOARD RETAINER ASSEMBLY

BACKGROUND OF THE INVENTION

I. Field of the Invention

The present invention relates to a retainer assembly for clamping a printed circuit board between spaced surfaces within a chassis, and particularly to a retainer assembly which facilitates entry and removal of a card from between those surfaces and which efficiently applies and relieves the clamping force between the board and the retainer.

II. Background of the Invention

Circuit board retainers have been developed to handle a broad range of applications. For example, such known retainers comprise a plastic guide that aligns the printed circuit board with an interface connector, or high-performance retainers that will captivate a printed circuit board under the most extreme shock and vibration conditions as encountered by military aircraft and spacecraft.

Of the known printed circuit board retainers one type, described in U.S. Pat. No. 4,823,951 comprises a partially threaded screw or rod and a plurality of members slidably mounted end-to-end on the rod. The members disposed on the rod have end portions which are wedge-shaped and engageable with one another and designed to move at least one of the members in a transverse direction relative to the rod when the members are moved towards one another along the rod.

The transverse direction in which at least one of the members is moved when the retainer is being locked acts to engage a clamping surface of that member against an edge of the printed circuit board. The opposite edge of the board is thereby brought into contact with and clamps against a spaced surface fixedly connected to or integral with the chassis in which the board is to be mounted. Typically, the rod in these prior art retainers is threaded on one end and the rod is rotated with an appropriate tool at the opposite end such that the threads of the rod engage with mating threads on a nut attached to one of the end-most members mounted on the rod. In this manner, the members are moved toward one another as the threaded rod is tightened.

In the above described retainers a problem is encountered upon unlocking of the retainer because the surface tension and friction between the clamping surface of the transversely movable member and the edge of the circuit board sometimes does not permit release of the board from the clamping surface of the member when the retainer is unlocked. Further contributing to this problem is the friction between the wedge-shaped end portions of adjacent members of the retainer. Since these wedge-shaped end portions engage with end portions of adjacent members to move at least one of the members into clamping engagement with the printed circuit board, when the retainer is unlocked the friction between the respective end portions sometimes restrains the members from returning to their unlocked positions thereby interfering with removal of the board from the chassis.

The amount of clamping force between the members of the retainer and the edge of the circuit board is dependent upon the torque applied to rotate the rod. Thus, for purposes of locking and unlocking the retainer to clamp or remove the printed circuit board from its chassis, efficient transfer and release of the torque, and hence the force applied to move the slidably mounted members, will result in improved operability of the retainer.

Printed circuit board chassis in most of the high-performance applications are sealed boxes which do not allow any air to pass over the circuit boards for the purpose of cooling the electronic components. The heat generated by these components is conducted through a metal heat sink attached to the printed circuit board and then transmitted to a heat exchanger or plenum. The critical thermal interface of the heat transfer path becomes the printed circuit board retainer. The amount of heat that can be transferred depends on the surface area of the retainer, the surface finish of the retainer, and the clamping pressure between the retainer and the printed circuit board.

It is, accordingly, an object of the present invention to provide a retainer and an assembly incorporating the retainer which efficiently transmits and releases forces applied between the rod and the slidably mounted members, and which acts to relieve surface tension between the board and the clamping surface of the members or the retainer.

Additional objects and advantages of the invention will be set forth in the description which follows and in part will be obvious from the description or may be learned by practice of the invention.

SUMMARY OF THE INVENTION

To achieve the foregoing objects and in accordance with the purposes of the invention as embodied and broadly described herein, an assembly for holding a printed circuit board between spaced surfaces is provided, comprising: a rod, and a plurality of members slidably mounted end-to-end on the rod with a least one of the members having an internal longitudinal channel with a transverse dimension greater than the corresponding outside dimension of the rod to thereby permit movement of the member along a transverse path relative to the rod. The member which moves transversely relative to the rod and the members adjacent to that member each have end portions engageable with one another and shaped to force the transversely movable member in its transverse direction upon forcing of the members towards one another along the rod. With sufficient movement in the transverse direction the member engages and clamps the printed circuit board against a fixed surface. The assembly further includes a mechanism for selectively applying the force to move the adjacent members towards one another on the rod. The rod and slidably mounted members are received in a recess defined by first and second side walls of a base structure. The recess has a width greater than the combined width of the transversely movable member and the edge of the printed circuit board which is to be retained by the assembly. The base structure further includes an abutment fixedly disposed at one end of the recess. The abutment includes an aperture therethrough for receiving the rod. Finally, means are provided, disposed between the abutment and one of the end-most adjacent members, for urging said members away from said abutment upon release of said selectively applied force.

The mechanism for applying force to move the members towards one another on the rod preferably comprises a head piece formed on one end of the rod and screw-like threads formed on the opposite of the rod for engaging mating threads to advance and retract the rod through the internal longitudinal channel of the transversely movable member as the rod is rotated. The threads to which the rod threads mate are preferably formed in a nut which is attached to one of the end-most slidably mounted members.

Preferably, a cylindrically shaped collar piece having an internal longitudinal channel adapted to receive the rod is disposed within the aperture of the abutment to transmit the force from the rod head to the slidably mounted members. The collar also acts a spacer permitting the headed end of the rod to remain easily accessible when the assembly is tightened down. Also, the collar is dimensioned so as to fit in the aperture of the abutment of the base structure thereby permitting the rod to "float" within the base structure by preventing the headed end of the rod from engaging the abutment.

In the preferred embodiment, the means for urging the members away from the abutment upon loosening of the assembly includes bevelled washers disposed on the rod between the abutment of the base structure and an end-most slidably mounted member. These bevelled washers are flattened when the retainer is in a loaded or locked state to provide a biasing force tending to oppose the applied force of the rod. The bias force of the bevelled washers aids in releasing the retainer by exerting a force which acts to overcome any surface tension or friction between the circuit board and the member clamping the board in place.

DESCRIPTION OF THE PREFERRED EMBODIMENT

Reference will now be made in detail to the present preferred embodiment of the invention as illustrated in the accompanying drawings.

Figure 1:
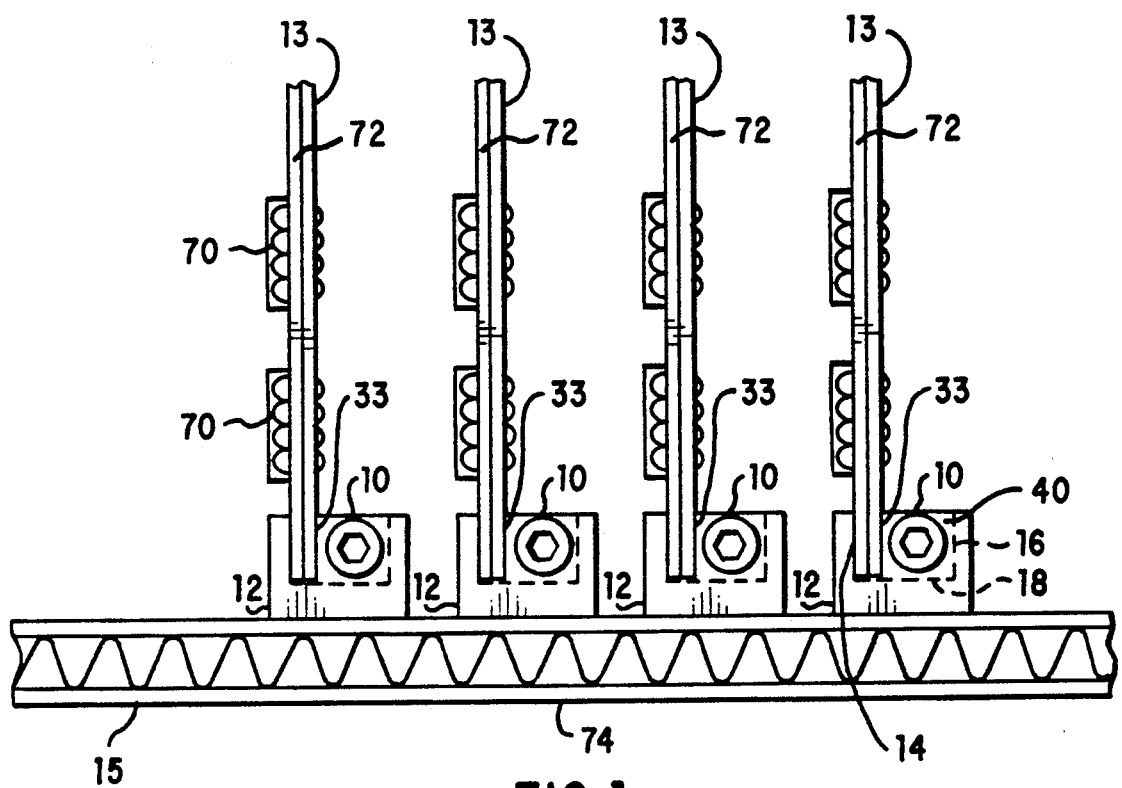
FIG. 1 is a partial side view of printed circuit boards held in a chassis using retainers of the present invention.

FIG. 1 is an end view of retainers 10 disposed in respective base structures 12. Each retainer 10 clamps a respective printed circuit board 13 within its base structure. Base structures 12 are fixedly mounted to an inner surface of a chassis wall 15 by brazing or by screws (not shown). Base structure 12 may also be integrally formed with wall 15. For purposes of example, only one of the retainers 10 and base structures 12 will be described below.

Base structure 12 includes side walls 14 and 16 which define a recess 18 which receives retainer 10. Recess 18 has a width which is greater than the width of the retainer 10 such that an edge of printed circuit board 13 may be inserted into recess 18 to be clamped between the retainer 10 and one of the side walls, in this instance side wall 14. Base structure 12 includes an abutment 40 formed at one end of recess 18. Abutment 40 has an aperture 43 formed therethrough.

Figure 2:
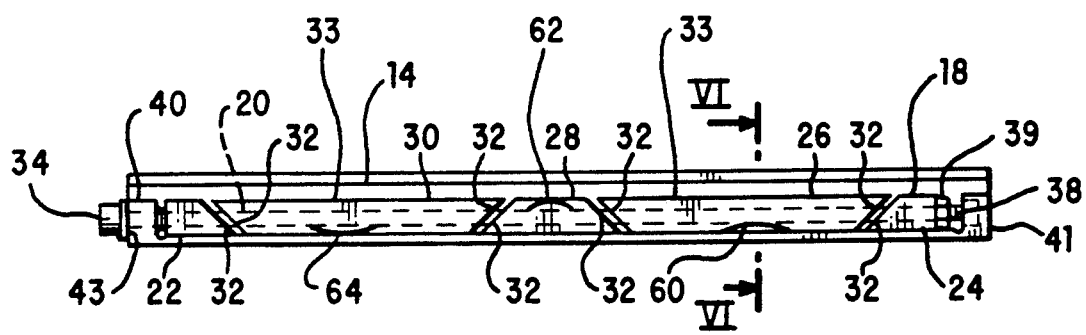
FIG. 2 is an illustration of a retainer incorporating the teachings of the subject invention wherein the retainer is in an unlocked state and includes five slidably mounted members disposed on the rod.
Figure 6A:
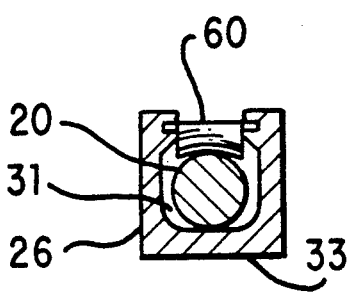
FIG. 6A is a cross-sectional view of the retainer of FIG. 2 taken along line VI—VI illustrating a leaf spring which biases a respective member against the rod.

With reference to FIG. 2, which is a top view of retainer 10 and base structure 12 with the printed circuit board removed, the retainer comprises a rod 20 and a plurality of members slidably mounted on the rod. In the preferred embodiment shown, the plurality of slidably mounted members includes end members 22 and 24, and intermediate members 26, 28, and 30. Intermediate members 26 and 30 are disposed adjacent member 28 and adjacent to respective ones of end members 22 and 24. With reference to FIG. 6A, each intermediate member 26, 28, and 30 is configured with an internal longitudinal channel 31 having a transverse dimension greater than the corresponding outside dimension of the rod so as to permit movement of the members along transverse directions 56 and 58 relative to the rod as will be described in detail below. End members 22 and 24 also are configured with an internal longitudinal channel for receiving rod 20, although the channel formed in the end members need not be formed with as great a transverse dimension as the channels of the intermediate members, since the end members are not required to move transversely relative to the rod.

Each end of intermediate members 26, 28, and 30 is configured with an inclined surface 32 which mates and slidably contacts the inclined surface 32 of an adjacent member. Similarly, the end members 22 and 24 each have an inclined surface 32 formed on one end thereof which mates and slidably contacts one end of a respective intermediate member 26 and 30. Intermediate members 26 and 30 have clamping surfaces 33 which engage with printed circuit board 13 as will be described below.

Figure 3:
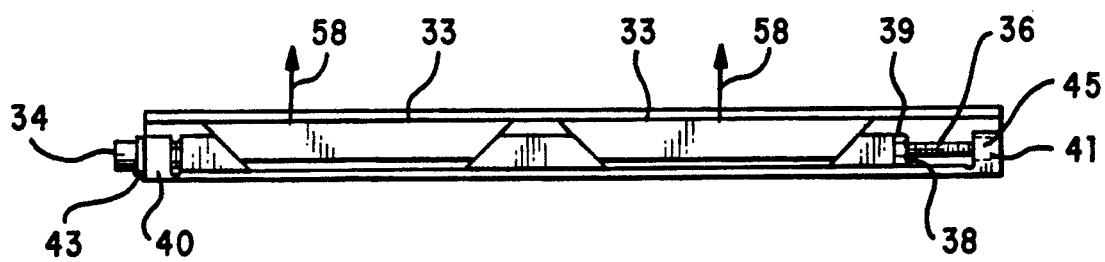
FIG. 3 is an illustration of the retainer of FIG. 2 in a locked position.

Retainer 10 further includes means for selectively applying force to move the slidably mounted members 22, 24, 26, 28, and 30 towards one another on the rod 20. As embodied herein, the means for selectively applying force to the slidably mounted members comprises a head piece 34 formed on one end of rod 20, and screwlike threads 36 formed on the opposite end of the rod. In this manner, as rod threads 36 engage with mating threads, the rod may be rotated to be advanced through the internal longitudinal channels 31 of the slidably mounted members, thereby causing the inclined edge-shaped surfaces 32 of respective members to "ride up" on the mating surface 32 of its adjacent member as the members are moved toward one another on rod 20 by effective shortening of the rod. Comparison of FIGS. 2 and 3 shows the relative movement of the members relative one another as the assembly is moved between the unlocked state of FIG. 2 and the locked state of FIG. 3.

In the preferred embodiment, a nut 39 having internal threads 38 is fixedly attached to end member 24 and aligned with the channel in end member 24 through which rod 20 is inserted. The threads 38 of nut 39 comprise the mating threads with which rod threads 36 engage. With reference to FIG. 3, as rod 20 is rotated in a first direction to engage rod threads 36 with mating threads 38 of nut 39, slidably mounted members 22, 24, 26, 28, and 30 are forced to move towards one another on rod 20 and the configuration of the inclined surfaces 32 of those members forces transverse members 26 and 30 in transverse direction 58 such that clamping surfaces 33 of members 26 and 30 engage an edge surface of printed circuit board 13 and force the opposite edge surface of the printed circuit board into contact with side wall 14 of base structure 12 thereby anchoring the printed circuit board in place.

As previously described, base structure 12 includes an abutment 40 disposed at one end of recess 18. Abutment 40 includes an aperture 43 therethrough for receiving rod 20. It is further preferable that base structure 12 includes a second abutment 41 formed at the opposite end of recess 18. Abutment 41 is formed with an indentation 45 for receiving the end-most threaded portion of rod 20. Indentation 45 does not extend completely through abutment 40. In this manner, rod 20, when inserted in indentation 45, is maintained and aligned in a substantially constant position relative to base structure 12 in both the locked and unlocked positions of the retainer assembly.

Figure 5B:
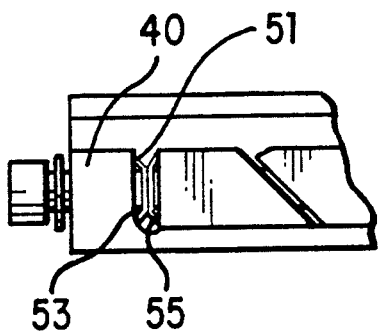
FIG. 5B is a detailed end view of the assembly of FIG. 5A in an unlocked state.
Figure 5A:
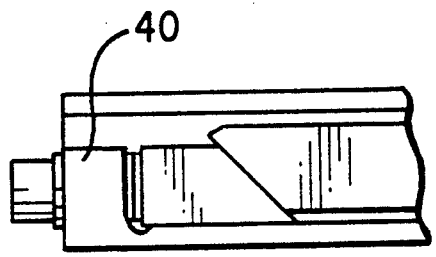
FIG. 5A is a second detailed end view of the assembly of the present invention in a locked state showing bevelled washers disposed on the rod between the abutment of the base structure in a locked state and one of the end-most slidably mounted members.

The assembly of the present invention includes means, disposed between the abutment of the base structure and one of the end-most slidably mounted members, for urging the members away from the abutment upon release of the force applied to move the members towards one another. As embodied herein, the urging means comprises at least one, and preferably a pair, of bevelled washers 51 disposed on rod 20 as illustrated in FIGS. 5A and 5B. Each washer 51 includes a substantially flat inner portion 53 having an aperture formed therethrough for receiving rod 20, and a bevelled circumferential outer portion 55 surrounding inner portion 53. The bevelled configuration of outer portions 55 is best illustrated in FIG. 5B.

Bevelled circumferential portions 55 of washers 51 are flattened against one another, against the end-face of end member 22; and against the opposing inner face of abutment 40 as rod 20 is tightened down to move the slidably mounted members towards one another. This flattened configuration of bevelled washers 51 is best illustrated in FIG. 5A. When flattened, bevelled circumferential portions 55 apply a force which opposes the force applied by tightening rod 20. Upon release of the force apply to move the slidably mounted members towards one another by counter-rotation of threaded rod 20, the bevelled circumferential portions 55 tend to assume their original configuration, thereby urging end member 22 and the remaining slidably mounted members disposed on rod 20 away from abutment 40. This urging force transferred to the slidably mounted members 22, 24, 26, 28, and 30 tends to move those members along rod 20 and thus parallel to the edge surface of printed circuit board 13 thereby tending to overcome any surface tension or friction between printed circuit board 13 and clamping surfaces 33 of intermediate members 26 and 30. Such movement of members 26 and 30 as washers 51 assume their original state assists in making a clean release between clamping surfaces 33 and the edge of the printed circuit board when the retainer assembly is being unlocked.

A "sticking" phenomenon sometimes occurs between clamping surfaces 33 and the edge of printed circuit board 13. This "sticking" phenomenon is caused by surface tension and friction between the clamping surfaces and the board, and is also caused by friction between engaged inclined surfaces 32 of the slidably mounted members, which friction tends to resist and prevent intermediate members 26, 28, and 30 from returning to their relaxed or unlocked positions as illustrated in FIG. 2. Because the urging force applied by bevelled washers 51 as they return to their original configuration tends to move the slidably mounted members in a direction parallel to the clamped edge of printed circuit board 13, that urging force is effective in overcoming the surface tension and friction forces between the printed circuit board and clamping surfaces 33, thereby facilitating removal of the printed circuit board from the retainer assembly of the present invention.

Figure 4:
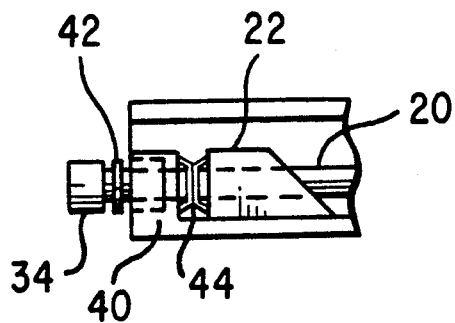
FIG. 4 is a detailed view of one end of the retainer assembly illustrated in FIG. 2 showing a collar mounted on the rod.

In a second embodiment of the present invention, the assembly includes collar means, disposed on the rod, for transferring the applied force between the rod and one of the end members, in this instance end member 22. As embodied herein, the collar means is illustrated in FIG. 4 and comprises a cylindrically shaped collar piece 42 having an internal longitudinal channel adapted to receive rod 20. Collar piece 42 is dimensioned so as to fit within aperture 43 of abutment 40. When head piece 34 of rod 20 is rotated through use of an appropriate tool such as an allen wrench (not shown) to move the slidably mounted members into a locked state wherein clamping surfaces 33 engage the edge of printed circuit board 13, collar piece 42 is engaged on one end by head piece 34 and engages end member 22 at the other end. Where the collar piece and the bevelled washers are both employed in the assembly of the present invention, collar piece 42 engages the bevelled washers and not end member 22 directly.

Collar piece 42 acts to efficiently transmit the force applied by rod 20 to end member 22, and therefrom to the remaining slidably mounted members on the pivot rod. Collar piece 42 also acts as a buffer between head piece 34 and end member 22 so that as the head piece and rod are torqued down, rotation of the rod is not transferred into rotation and wear on end member 22. Collar piece 42 also acts as a spacer between end member 22 and head piece 34 of rod 20 so as to maintain head piece 34 in a position extending beyond abutment 40 thereby facilitating use of an appropriate tool for engaging head piece 34 to rotate rod 20. Also, because rod 20 extends within collar piece 42 and does not engage abutment 40, the rod "floats" within the assembly and is more easily rotated to lock and unlock the retainer.

Figure 6B:
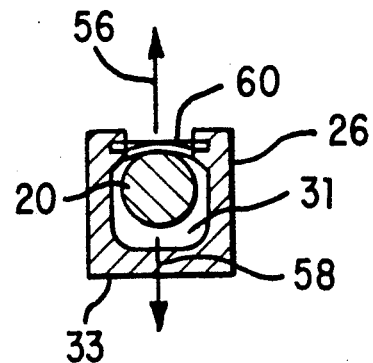
FIG. 6B is the view of FIG. 6A with the retainer assembly in a locked state.

Retainer 10 may also include means, attached at least to certain ones of the intermediate members, for applying a spring bias between those intermediate members and the rod. The means for applying such spring bias is embodied in leaf springs 60, 62, and 64 which bias a respective one of intermediate members 26, 28, and 30 against rod 20 as illustrated in FIGS. 6A and 6B. That spring bias opposes movement of a respective intermediate member in the transverse directions 56 and 58 relative to rod 20.

FIGS. 6A and 6B illustrate in detail a representative one of the leaf springs, in this instance leaf spring 60, disposed so as to bias intermediated member 26 against rod 20. In FIG. 6A, leaf spring 60 is flexed such as when intermediate member 26 is moved transversal relative to the rod to engage its clamping surface 33 against circuit board 13. FIG. 6B illustrates the position of leaf spring 60 when the retainer is in an unlocked position and clamping surface 33 of member 26 does not contact the circuit board. Leaf springs 60, 62, and 64 serve to maintain the alignment of intermediate members relative to rod 20 to thereby facilitate removal and insertion of the printed circuit board from its chassis. As rod 20 is rotated to unscrew rod threads 36 from mating threads 38, the spring bias action of leaf springs 60, 62, and 64 act to align the intermediate members and end members relative to one another.

When the retainer embodying the features described above is activated by means of torquing and rotating rod 20, pressure between clamping surfaces 33, circuit board 13, and side wall 14 is generated. The contact between these members also comprises the thermal interface between the circuit board and the heat sink of the chassis. The high clamping pressure achievable with the present invention results in the circuit board being tightly held even during high shock or vibration environments. Transfer of heat from the components mounted on board 13 in the conduction mode depends on the surface area, surface finish, and clamping pressure of the contact and clamping surfaces comprising the heat transfer path. With reference to FIG. 1, the conduction heat transfer path is as follows: heat is generated by the components 70 mounted on the printed circuit board 13. A heat sink 72 is disposed between components 70 and circuit board 13. As the components generate heat, that heat is conducted through heat sink 72 to the clamping surfaces 33 of retainer 10 and from there through base structure 12 and into chassis wall 15. When the chassis is hermetically sealed, cooling air flows only over the outer surface 74 of chassis wall 15 and removes heat in a convection heat transfer mode.

Because heat transfer is influenced by the amount of clamping pressure between clamping surfaces 33, side wall 14, and circuit board 13, the present invention acts to increase the effective amount of heat transfer from the circuit board due to its ability to efficiently transfer the force applied by rotating rod 20 into the transversely directed clamping force of clamping surfaces 33.

Although a retainer employing a total of five members is disclosed as the preferred embodiment of the present invention, retainers with less or more members are also contemplated, depending on the length of the circuit board to be mounted.

Additional advantages and modifications will readily occur to those skilled in the art. The invention in its broader aspects is, therefore, not limited to the specific details, representative apparatus, and illustrative examples shown and described. Accordingly, departures may be made from such details without departing from the spirit or scope of Applicant's inventive concept.

WHAT WE CLAIM IS:

1. An assembly for holding printed circuit boards, comprising:
   a rod;
   a plurality of members slidably mounted end-to-end on said rod, at least one of said members having a predetermined width and an internal longitudinal channel with a transverse dimension greater than the corresponding outside dimension of said rod to permit movement of said one member along a transverse path relative said rod, said one member and members adjacent said one member each having end portions engageable one another and shaped to force said one member to move in a first direction along said transverse path relative said adjacent members upon forcing of said adjacent members toward said one member;
   means for selectively applying force to move said adjacent members towards said one member;
   a base structure having first and second side walls defining a recess for receiving said rod and said plurality of members mounted on said rod and for receiving an edge of a printed circuit board adjacent said members, said base structure having an abutment fixedly disposed at one end of said recess, said abutment having an aperture formed therethrough for receiving said rod; and
   means, disposed between said abutment and one of said adjacent members, for urging said members away from said abutment upon release of said selectively applied force.

2. The assembly of claim 1, including means, attached at least to said one member, for applying a spring bias between said rod and said on member opposing movement of said one member in said first direction.

3. The assembly of claim 1, wherein said urging means comprises at least one bevelled washer disposed on said rod.

4. The assembly of claim 3, wherein said washer includes an inner portion and a bevelled circumferential portion surrounding said inner portion, said bevelled circumferential portion being flattened between said abutment and said one of said adjacent members upon application of said selectively applied force, and upon release of said selectively applied force said bevelled circumferential portion assumes its original configuration thereby urging said members away from said abutment.

5. The assembly of claim 4, including a second washer, disposed on said rod, having a bevelled circumferential portion, said washers being disposed on said rod such that the bevelled circumferential portion of each extends in opposite directions along said rod.

6. The assembly of claim 1, wherein said means for selectively applying force comprises a head piece formed on one end of said rod and screw-like threads formed on the opposite end of said rod for engaging mating threads to advance and retract said rod through said internal longitudinal channel of said at least one member as said rod is rotated.

7. The assembly of claim 6, wherein said mating threads are formed in a nut fixedly attached to one of said adjacent members.

8. The assembly of claim 1, wherein said base structure includes a second abutment fixedly disposed at the opposite end of said recess relative to the other abutment, said second abutment having an indentation formed therein for receiving one end of said rod to thereby maintain the alignment of said rod relative said base structure.

9. An assembly for holding a printed circuit board between spaced surfaces, comprising:
   a rod;
   a plurality of members slidably mounted end-to-end on said rod, at least one of said members having an internal longitudinal channel having a transverse dimension greater than the corresponding outside dimension of said rod to permit movement of said one member along a transverse path relative said rod, said one member and members adjacent said one member each having end portions engageable one another and shaped to force said one member to move in a first direction along said transverse path relative said adjacent members upon forcing of said adjacent members toward said one member;

means for selectively applying force to move said adjacent members towards said one member;

collar means, disposed on said rod, for transferring said applied force to said members; and a base structure having first and second side walls defining a recess for receiving said rod and said plurality of members mounted on said rod and for receiving an edge of a printed circuit board adjacent said members, said base structure having an abutment fixedly disposed at one end of said recess, said abutment having an aperture therethrough for receiving said rod and said collar means.

10. The assembly of claim 9, including means, attached at least to said one member, for applying a spring bias between said rod and said one member opposing movement of one member in said first direction.

11. The assembly of claim 9, wherein said collar means comprises a cylindrically shaped collar piece having an internal longitudinal channel adapted to receive said rod.

12. The assembly of claim 11, wherein said means for selectively applying force comprises a head piece formed on one end of said rod and screw-like threads formed on the opposite end of said rod for engaging mating threads to advance and retract said rod through said internal longitudinal channel of said at least one member as said rod is rotated.

13. The assembly of claim 9, including means, disposed between said abutment and one of said adjacent members, for urging said members away form said abutment upon release of said selectively applied force.

* * * * *